(12) United States Patent
Chen et al.

(10) Patent No.: US 10,425,086 B1
(45) Date of Patent: Sep. 24, 2019

(54) DIVIDER-LESS PHASE LOCKED LOOP

(71) Applicant: KaiKu Tek Inc., Taipei (TW)

(72) Inventors: Pang-Ning Chen, Taipei (TW);
Chen-Lun Lin, Taipei (TW);
Ying-Chia Chen, Taipei (TW);
Wei-Jyun Wang, Taipei (TW); Mike Chun-Hung Wang, Taipei (TW)

(73) Assignee: KaiKuTek Inc., Taipei (TW)

( * ) Notice: Subject to any disclaimer, the term of this patent is extended or adjusted under 35 U.S.C. 154(b) by 0 days.

(21) Appl. No.: 16/150,447

(22) Filed: Oct. 3, 2018

Related U.S. Application Data

(60) Provisional application No. 62/656,999, filed on Apr. 13, 2018.

(51) Int. Cl.
| | | |
|---|---|---|
| *H03L 7/08* | (2006.01) | |
| *H03L 7/089* | (2006.01) | |
| *H03L 7/081* | (2006.01) | |
| *H03L 7/16* | (2006.01) | |

(52) U.S. Cl.
CPC .......... *H03L 7/0891* (2013.01); *H03L 7/0816* (2013.01); *H03L 7/0818* (2013.01); *H03L 7/16* (2013.01)

(58) Field of Classification Search
CPC combination set(s) only.
See application file for complete search history.

(56) References Cited

U.S. PATENT DOCUMENTS

| | | | | |
|---|---|---|---|---|
| 5,191,295 | A * | 3/1993 | Necoechea | G01R 31/2846 327/158 |
| 5,614,855 | A * | 3/1997 | Lee | H03L 7/0812 327/156 |
| 6,794,913 | B1 * | 9/2004 | Stengel | H03L 7/0814 327/158 |
| 7,602,254 | B2 * | 10/2009 | Sandner | H03L 7/23 327/147 |
| 7,737,743 | B1 * | 6/2010 | Gao | H03L 7/087 327/156 |
| 8,773,182 | B1 * | 7/2014 | Degani | H03L 7/085 327/147 |
| 8,779,812 | B1 * | 7/2014 | Kavanagh | H03L 7/087 327/150 |
| 9,941,890 | B2 * | 4/2018 | Leong | H03L 7/0807 |
| 10,050,634 | B1 * | 8/2018 | Zhao | H03L 7/0891 |
| 10,116,315 | B1 * | 10/2018 | Zhuang | H03L 7/1976 |
| 10,148,275 | B1 * | 12/2018 | Pi | H03L 7/1974 |
| 10,171,089 | B2 * | 1/2019 | Kuo | H03L 1/00 |

(Continued)

*Primary Examiner* — Adam D Houston
(74) *Attorney, Agent, or Firm* — Alan D. Kamrath; Mayer & Williams PC

(57) ABSTRACT

A divider-less phase locked loop (PLL) includes a phase frequency detector (PFD), a charge pump (CP), a voltage controlled oscillator (VCO), a delay unit, and a clock gating unit. The PFD is electrically connected to the VCO through the CP, and the CP outputs a voltage control signal to the VCO. The VCO generates an output signal. The delay unit receives and delays a reference signal to generate a delay signal. The clock gating unit samples the output signal according to the delay signal. Since the clock gating unit samples the output signal according to the delay signal, the divider-less PLL does not need to include a divider to divide a frequency of the output signal. Therefore, power consumption of the divider-less PLL can be reduced.

10 Claims, 18 Drawing Sheets

(56) References Cited

U.S. PATENT DOCUMENTS

| | | | | |
|---|---|---|---|---|
| 10,205,460 B2* | 2/2019 | Guo | | H03L 7/1976 |
| 2004/0232995 A1* | 11/2004 | Thomsen | | H03L 1/022 |
| | | | | 331/2 |
| 2004/0232997 A1* | 11/2004 | Hein | | H03L 1/022 |
| | | | | 331/16 |
| 2005/0162204 A1* | 7/2005 | Lee | | H03L 7/00 |
| | | | | 327/158 |
| 2006/0119402 A1* | 6/2006 | Thomsen | | H03L 7/0898 |
| | | | | 327/105 |
| 2008/0204092 A1* | 8/2008 | Moehlmann | | H03L 7/093 |
| | | | | 327/156 |
| 2009/0085677 A1* | 4/2009 | Lewis | | H03L 7/085 |
| | | | | 331/1 A |
| 2010/0056201 A1* | 3/2010 | Akamine | | H04B 1/0017 |
| | | | | 455/552.1 |
| 2011/0156783 A1* | 6/2011 | Pavlovic | | H03L 7/081 |
| | | | | 327/159 |
| 2012/0235717 A1* | 9/2012 | Hirai | | H03L 7/0891 |
| | | | | 327/156 |
| 2012/0319749 A1* | 12/2012 | Thaller | | H03L 7/183 |
| | | | | 327/158 |
| 2013/0033293 A1* | 2/2013 | Zhang | | H03L 7/1976 |
| | | | | 327/156 |
| 2013/0147529 A1* | 6/2013 | Ganesan | | H03L 7/1803 |
| | | | | 327/156 |
| 2013/0147531 A1* | 6/2013 | Lee | | H03L 7/085 |
| | | | | 327/158 |
| 2013/0301754 A1* | 11/2013 | Staszewski | | H04L 27/12 |
| | | | | 375/302 |
| 2014/0118038 A1* | 5/2014 | Lin | | H03L 7/105 |
| | | | | 327/149 |
| 2014/0198830 A1* | 7/2014 | Sen | | H04L 25/0204 |
| | | | | 375/150 |
| 2014/0320181 A1* | 10/2014 | Mitric | | H03L 7/10 |
| | | | | 327/156 |
| 2014/0340133 A1* | 11/2014 | Gasiot | | H03L 7/0891 |
| | | | | 327/157 |
| 2015/0160687 A1* | 6/2015 | Ciesla | | G06F 1/08 |
| | | | | 713/500 |
| 2015/0229317 A1* | 8/2015 | Juneau | | H03L 7/18 |
| | | | | 327/105 |
| 2016/0056827 A1* | 2/2016 | Vlachogiannakis | | |
| | | | | H03B 5/1265 |
| | | | | 327/158 |
| 2016/0061972 A1* | 3/2016 | Laine | | G01V 1/223 |
| | | | | 367/14 |
| 2016/0126960 A1* | 5/2016 | Whatmough | | H03L 7/0992 |
| | | | | 327/156 |
| 2016/0173067 A1* | 6/2016 | Sanchez | | H03L 7/00 |
| | | | | 327/156 |
| 2016/0182067 A1* | 6/2016 | Liu | | H03L 7/091 |
| | | | | 327/158 |
| 2016/0191284 A1* | 6/2016 | Izawa | | H04B 15/04 |
| | | | | 375/375 |
| 2016/0211855 A1* | 7/2016 | Unruh | | H03L 7/1974 |
| 2016/0226443 A1* | 8/2016 | Caffee | | H03B 5/1234 |
| 2017/0093412 A1* | 3/2017 | Van Brunt | | H03L 7/091 |
| 2017/0097613 A1* | 4/2017 | Tertinek | | H03L 7/085 |
| 2017/0214408 A1* | 7/2017 | Liang | | H03L 7/099 |
| 2017/0244544 A1* | 8/2017 | Galton | | H03L 7/093 |
| 2017/0331483 A1* | 11/2017 | Hossain | | H03L 7/235 |
| 2018/0278259 A1* | 9/2018 | Ii | | G01C 19/5776 |
| 2019/0131983 A1* | 5/2019 | Jain | | H03L 7/1976 |

\* cited by examiner

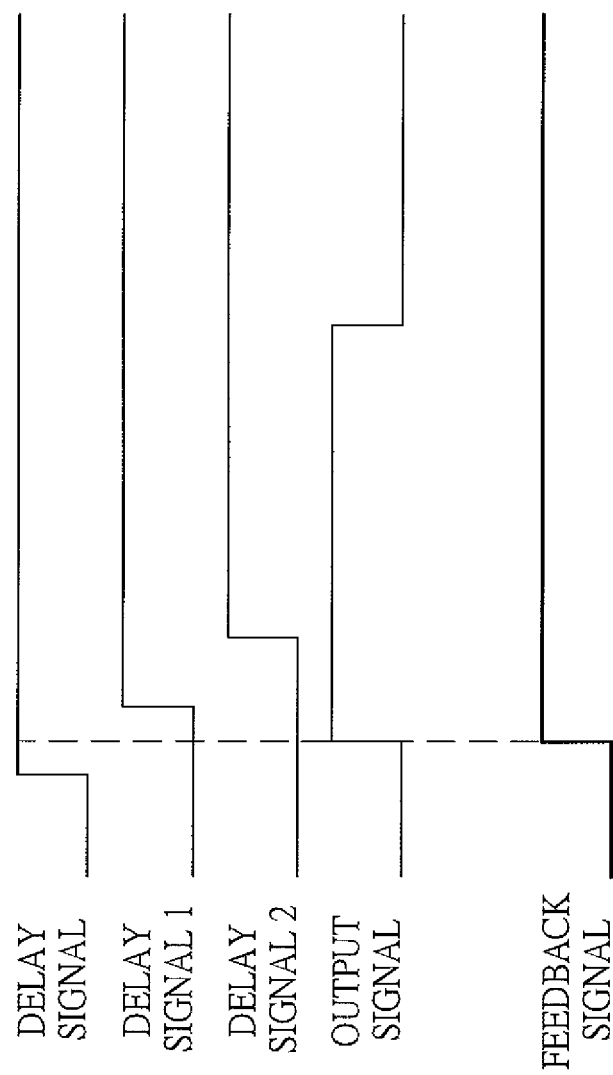

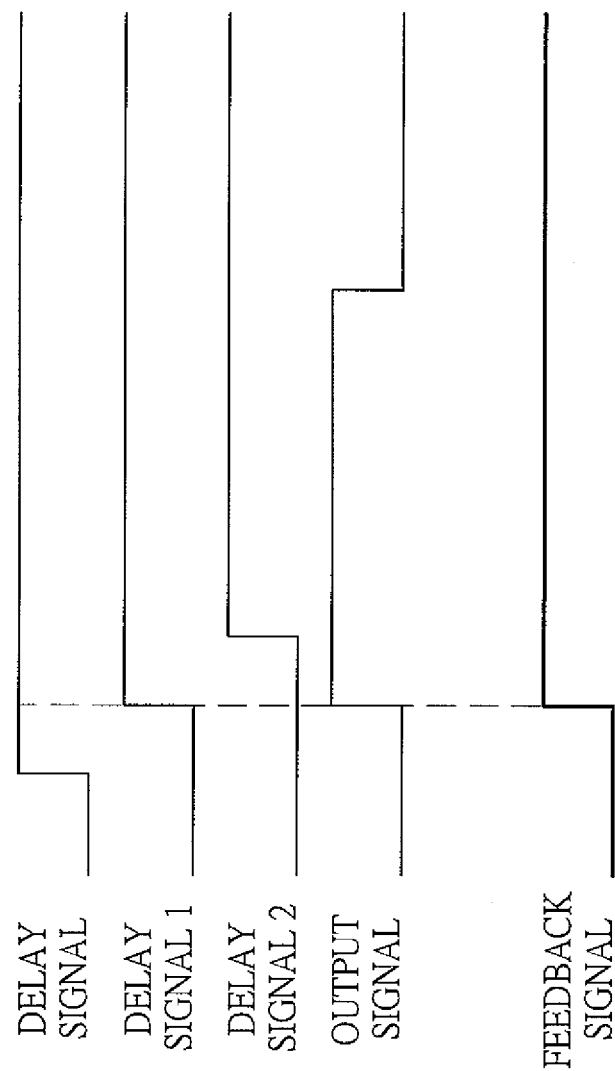

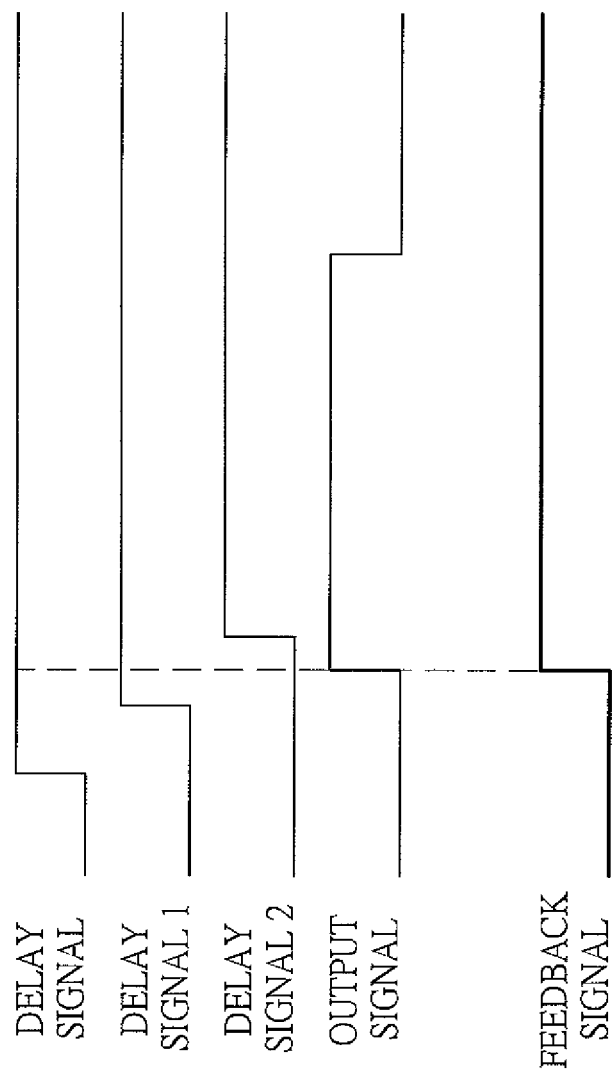

US 10,425,086 B1

DIVIDER-LESS PHASE LOCKED LOOP

BACKGROUND OF THE INVENTION

1. Field of the Invention

The present invention relates to a phase locked loop (PLL), and more particularly to a divider-less PLL.

2. Description of the Related Art

With reference to FIG. 12, a phase locked loop (PLL) generally includes a phase frequency detector (PFD) 121, a charge pump (CP) 122, a loop filter (LP) 123, a voltage controlled oscillator (VCO) 124, and a divider 125. The PFD 121 receives two input signals and produces an error signal which is proportional to a phase difference between the two input signals. The PFD 121 outputs the error signal to the CP 122. The CP 122 produces a control signal according to the error signal, and outputs the control signal to the VCO 124 through the LP 123. The VCO 124 produces an output signal with an output frequency according to the control signal.

The divider 125 receives the output signal and produces a feedback signal with a feedback frequency. The PFD 121 receives a reference signal with a reference frequency and the feedback signal, and the two input signals of the PFD 121 respectively are the reference signal and the feedback signal. The divider 125 performs phase tracking such that the feedback frequency for the PFD 121 is equal to the reference frequency for the PFD 121.

For example, N is a divisor decided by the divider 125. The divider 125 divides the frequency of the output signal by N to produce the feedback signal with the feedback frequency. Namely, $f_{rf} \div N = f_{fb}$. $f_{rf}$ is the frequency of the output signal, and $f_{fb}$ is the feedback frequency. The divider 125 will adjust N until the feedback frequency of the feedback signal equals the reference frequency of the reference signal.

However, the divider is associated with large power consumption, which is not desirable in most scenarios. Therefore, the PLL needs to be further improved.

SUMMARY OF THE INVENTION

An objective of the present invention is to provide a divider-less phase locked loop (PLL). The present invention may reduce power consumption of the PLL.

The divider-less PLL includes a phase frequency detector (PFD), a charge pump (CP), a voltage controlled oscillator (VCO), a delay unit, and a clock gating unit.

The PFD generates an up signal and a down signal. The CP is electrically connected to the PFD, and generates a voltage control signal according to the up signal and the down signal.

The VCO is electronically connected to the CP, and generates an output signal according to the voltage control signal. The delay unit receives a reference signal, and delays the reference signal to generate a delay signal. The clock gating unit is electrically connected to the PFD, the VCO, and the delay unit.

The clock gating unit samples the output signal according to the delay signal to generate a feedback signal. The PFD receives the reference signal and the feedback signal, and generates the up signal and the down signal according to the reference signal and the feedback signal.

Since the clock gating unit of the present invention samples the output signal according to the delay signal and generates the feedback signal to the PFD, the present invention does not need to include a divider to divide a frequency of the output signal.

The feedback signal can be generated by sampling the output signal within a determined time period corresponding to the delay signal.

Therefore, the present invention does not have a divider, and power consumption of the divider-less PLL of the present invention can be reduced.

BRIEF DESCRIPTION OF THE DRAWINGS

FIG. 8(a) is a waveform diagram of signals of the second embodiment of the digital to time convertor of the divider-less PLL of the present invention in a first case;

FIG. 8(b) is a waveform diagram of signals of the second embodiment of the digital to time convertor of the divider-less PLL of the present invention in a second case;

FIG. 8(c) is a waveform diagram of signals of the second embodiment of the digital to time convertor of the divider-less PLL of the present invention in a third case;

DETAILED DESCRIPTION OF THE INVENTION

Figure 1:
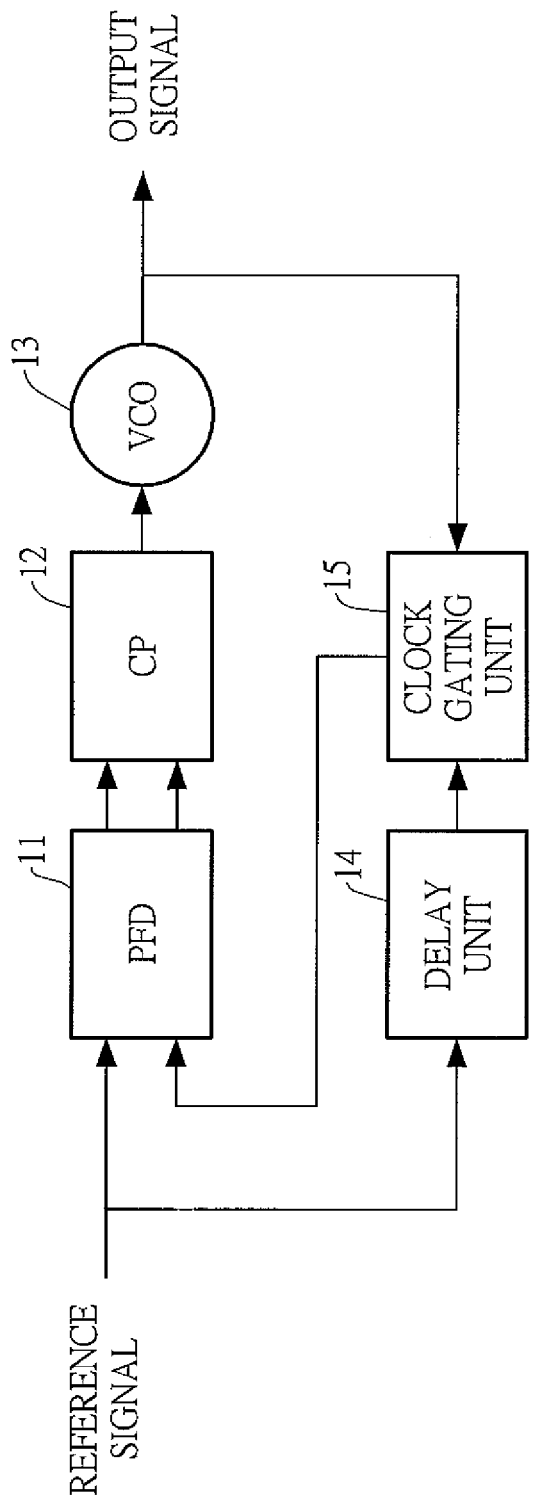
FIG. 1 is a block diagram of a first embodiment of a divider-less PLL of the present invention.

With reference to FIG. 1, the present invention relates to a divider-less phase locked loop (PLL). The divider-less PLL includes a phase frequency detector (PFD) 11, a charge pump (CP) 12, a voltage controlled oscillator (VCO) 13, a delay unit 14, and a clock gating unit 15.

The PFD 11 generates an up signal and a down signal. The CP 12 is electrically connected to the PFD 11, and generates a voltage control signal according to the up signal and the down signal.

The VCO 13 is electronically connected to the CP 12, and generates an output signal according to the voltage control signal. The delay unit 14 receives a reference signal, and delays the reference signal to generate a delay signal. The clock gating unit 15 is electrically connected to the PFD 11, the VCO 13, and the delay unit 14.

The clock gating unit 15 samples the output signal according to the delay signal to generate a feedback signal. The PFD 11 receives the reference signal and the feedback signal, and generates the up signal and the down signal according to the reference signal and the feedback signal.

Since the clock gating unit 15 of the present invention samples the output signal according to the delay signal and generates the feedback signal to the PFD 11, the present invention does not need to include a divider to divide a frequency of the output signal. The feedback signal can be generated by sampling the output signal within a determined time period corresponding to the delay signal.

Therefore, the present invention does not have a divider, and power consumption of the divider-less PLL of the present invention can be reduced.

Figure 2:
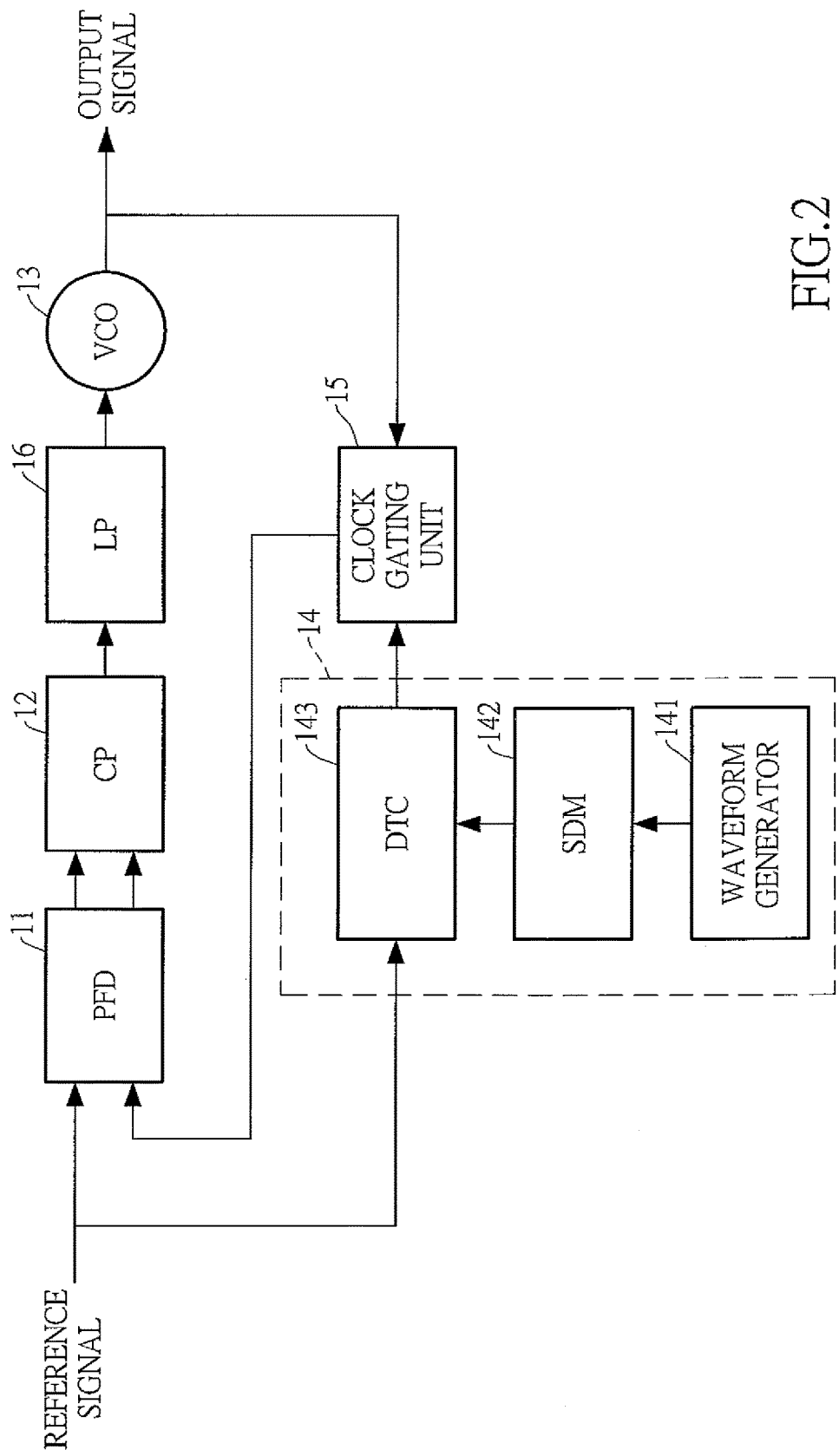
FIG. 2 is a block diagram of a second embodiment of the divider-less PLL of the present invention.

With reference to FIG. 2, the divider-less PLL further includes a loop filter (LP) 16. The CP 12 is electrically connected to the VCO 13 through the LP 16, and the LP 16 can filter the voltage control signal. In an embodiment of the present invention, the LP 16 is a low pass filter. The VCO 13 is controlled by a direct current (DC) signal, and the LP 16 can attenuate signals with a frequency higher than a cutoff frequency. Therefore, the LP 16 can reduce a noise in the voltage control signal.

Moreover, the delay unit 14 of the divider-less PLL includes a waveform generator 141, a sigma delta modulator (SDM) 142, and a digital to time convertor (DTC) 143.

The waveform generator 141 generates a waveform signal. The waveform signal can be set by a user to decide a multiple between an output frequency of the output signal and a reference frequency of the reference signal.

The SDM 142 is electrically connected to the waveform generator 141, and generates a control signal according to the waveform signal.

The DTC 143 is electrically connected to the SDM 142 and the waveform generator 141. The DTC 143 receives the reference signal, delays the reference signal to generate the delay signal according to the control signal, and outputs the delay signal to the clock gating unit 15.

In the embodiment of the present invention, a model of the SDM 142 of the delay unit 14 is MASH 1-1-1.

Figure 3:
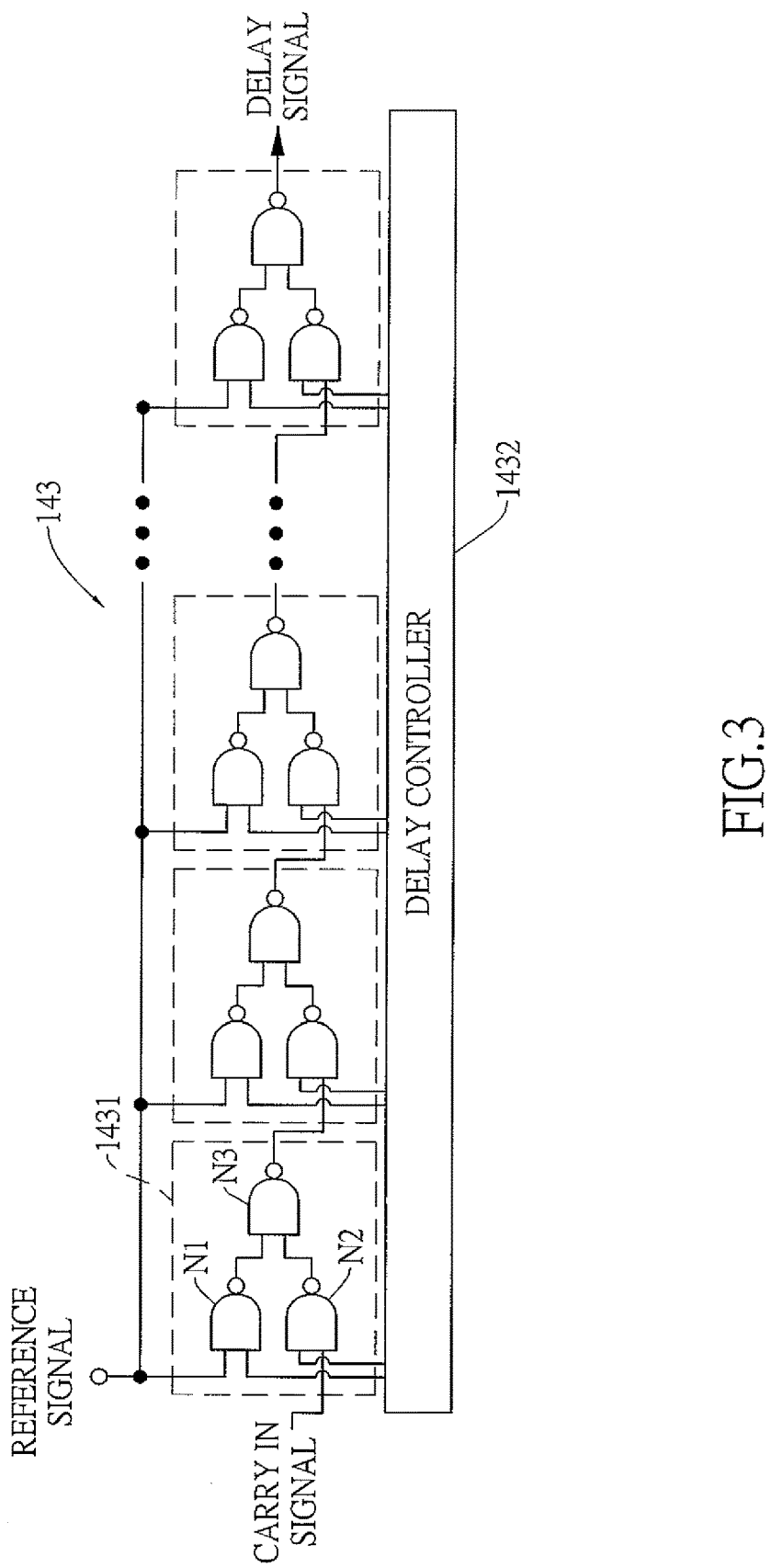
FIG. 3 is a block diagram of a first embodiment of a digital to time convertor of the divider-less PLL of the present invention.

Further with reference to FIG. 3, a first embodiment of the DTC 143 includes a plurality of unit cells 1431 and a delay controller 1432. The unit cells 1431 are connected in series, and each one of the unit cells 1431 includes a first nand gate N1, a second nand gate N2, and a third nand gate N3.

The first nand gate N1 includes two first inputs and a first output. One of the two first inputs receives the reference signal, and another one of the two first inputs is electrically connected to the delay controller 142.

The second nand gate N2 includes two second inputs and a second output. One of the two second inputs is electrically connected to the delay controller 142.

The third nand gate N3 includes two third inputs and a third output. One of the two third inputs is electrically connected to the first output, and another one of the two third inputs is electrically connected to the second output. Another one of the two second inputs is electrically connected to the third output of a preceding unit cell.

In the embodiment, one of the two second inputs of the first unit cell is electrically connected to the delay controller 142, and another one of the two second inputs receives a carry in signal. The third output of the last unit cells is electrically connected to the clock gating unit 15 to output the delay signal.

The delay controller 1432 is electrically connected to the SDM 142, generates a delay control signal according to the control signal, and outputs the delay control signal to the unit cells 1431.

The delay controller 1432 generates the delay control signal to control a signal path of the reference signal. Namely, the delay controller 1432 can decide a number of the unit cells 1431 which the reference signal passes through. When the number of the unit cells 1431 which the reference signal passes through is increased, the reference signal can be delayed for a longer time period. In other words, a phase difference between the reference signal and the delay signal can be increased.

Figure 4A:
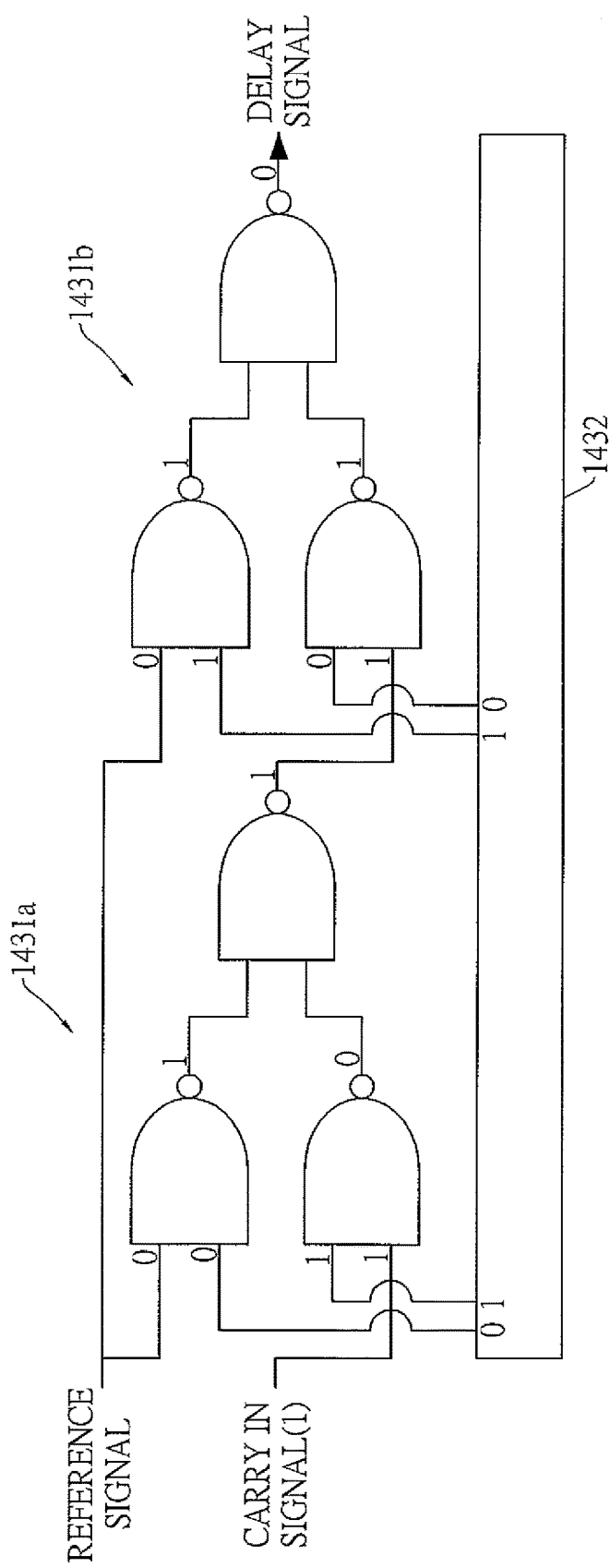
FIG. 4(a) is a block diagram of the first embodiment of the digital to time convertor of the divider-less PLL of the present invention.
Figure 4B:
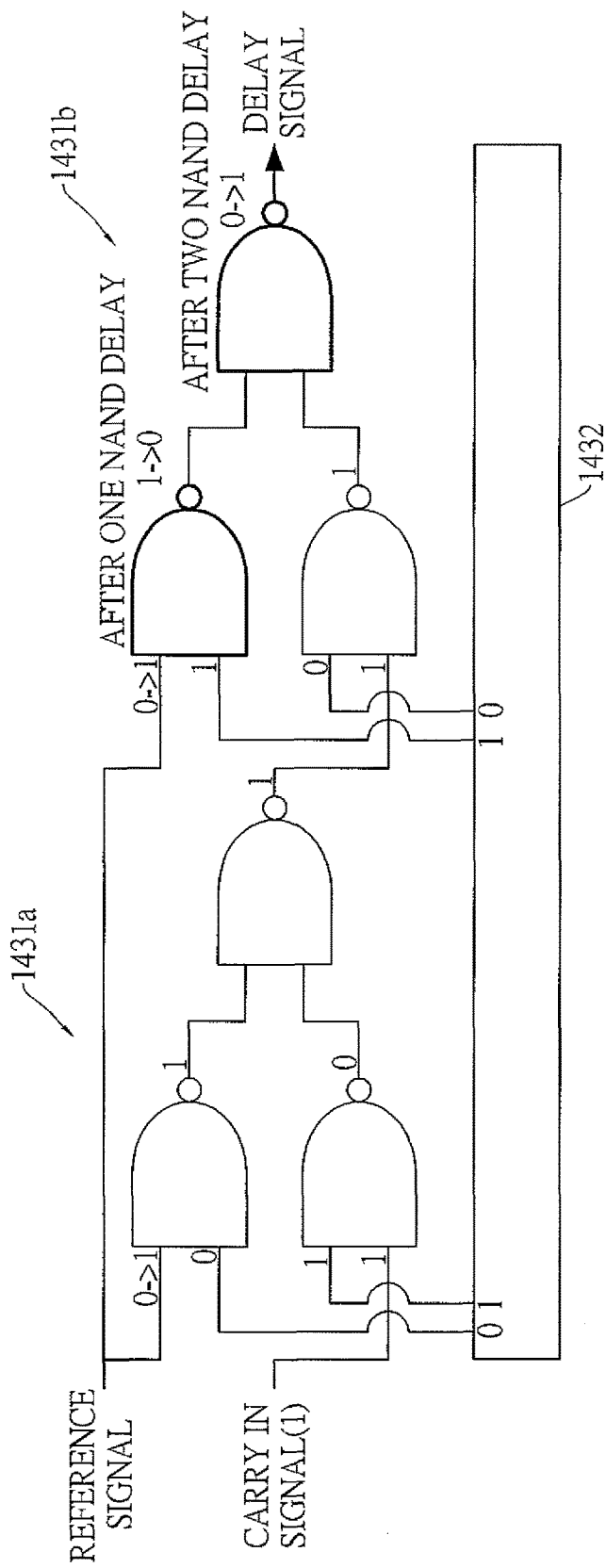
FIG. 4(b) is a block diagram of the first embodiment of the digital to time convertor of the divider-less PLL of the present invention.
Figure 4C:
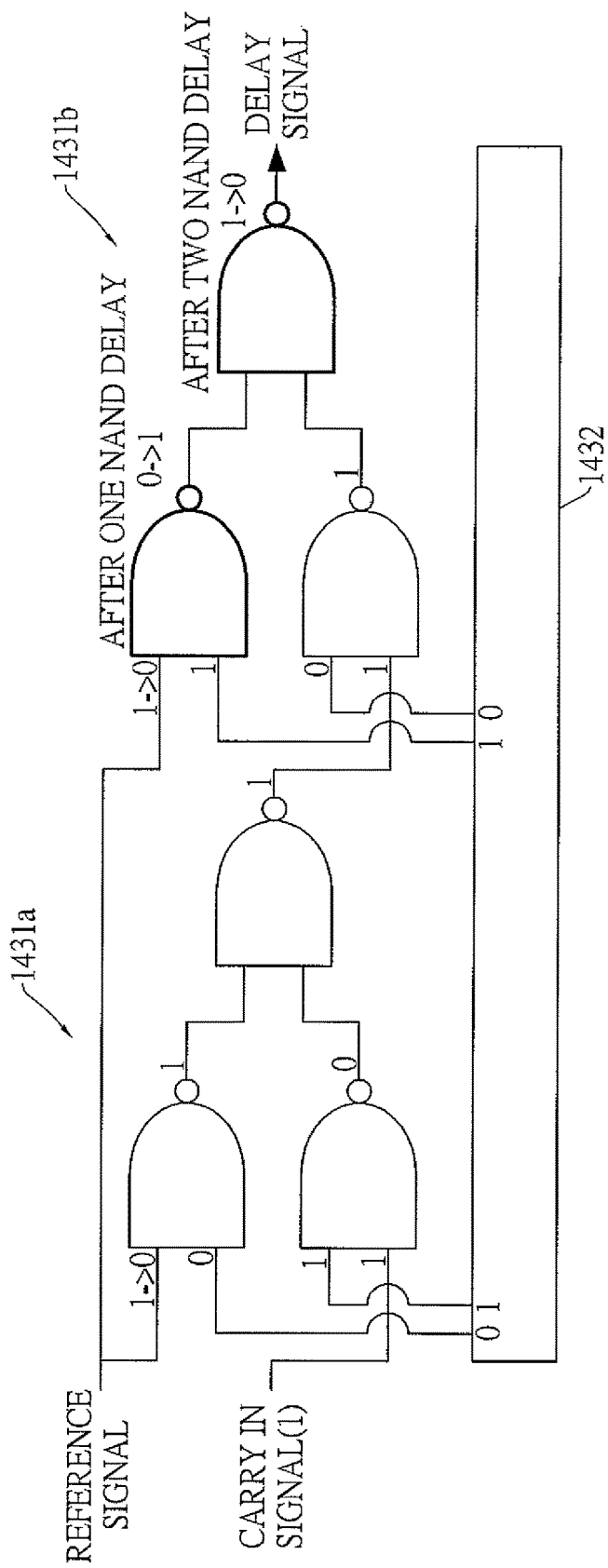
FIG. 4(c) is a block diagram of the first embodiment of the digital to time convertor of the divider-less PLL of the present invention.

For example, with reference to FIGS. 4(a) to 4(c), the DTC 143 includes two unit cells 1431. The carry in signal is digital 1, the delay control signal inputted into the first nand gate of the first unit cell 1431a is digital 0, the delay control signal inputted into the second nand gate of the first unit cell 1431a is digital 1, the delay control signal inputted into the first nand gate of the second unit cell 1431b is digital 1, and the delay control signal inputted into the second nand gate of the second unit cell 1431b is digital 0.

As shown in FIG. 4(a), in an initial state, the reference signal is digital 0, and the delay signal is also digital 0.

As shown in FIG. 4(b), when the reference signal is changed from digital 0 to digital 1, the third output of the first unit cell 1431a may not be changed.

However, the first output of the second unit cell 1431b will be changed from digital 1 to digital 0 after one nand delay, and the third output of the second unit cell 1431b will be changed from digital 0 to digital 1 after two nand delays.

As shown in FIG. 4(c), when the reference signal is changed from digital 1 to digital 0, the third output of the first unit cell 1431a may not be changed.

However, the first output of the second unit cell 1431b will be changed from digital 0 to digital 1 after one nand delay, and the third output of the second unit cell 1431b will be changed from digital 1 to digital 0 after two nand delays.

Figure 5A:
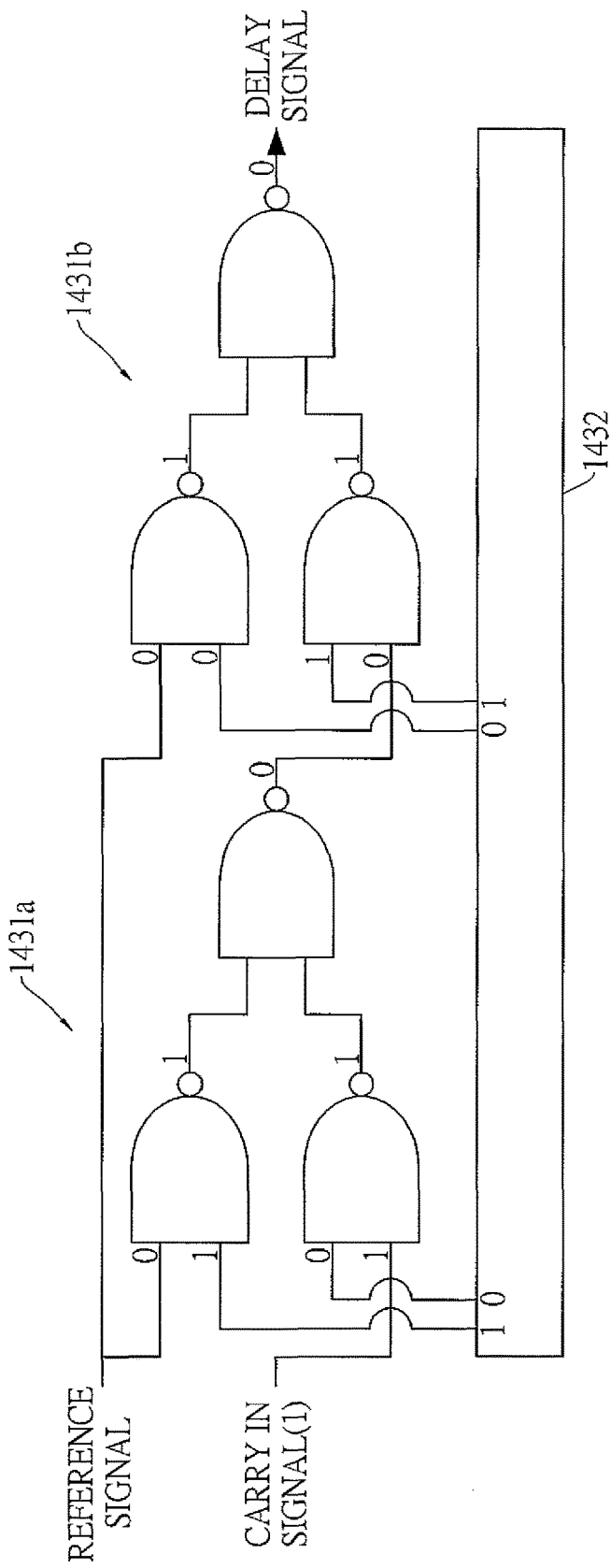
FIG. 5(a) is a block diagram of the first embodiment of the digital to time convertor of the divider-less PLL of the present invention.
Figure 5B:
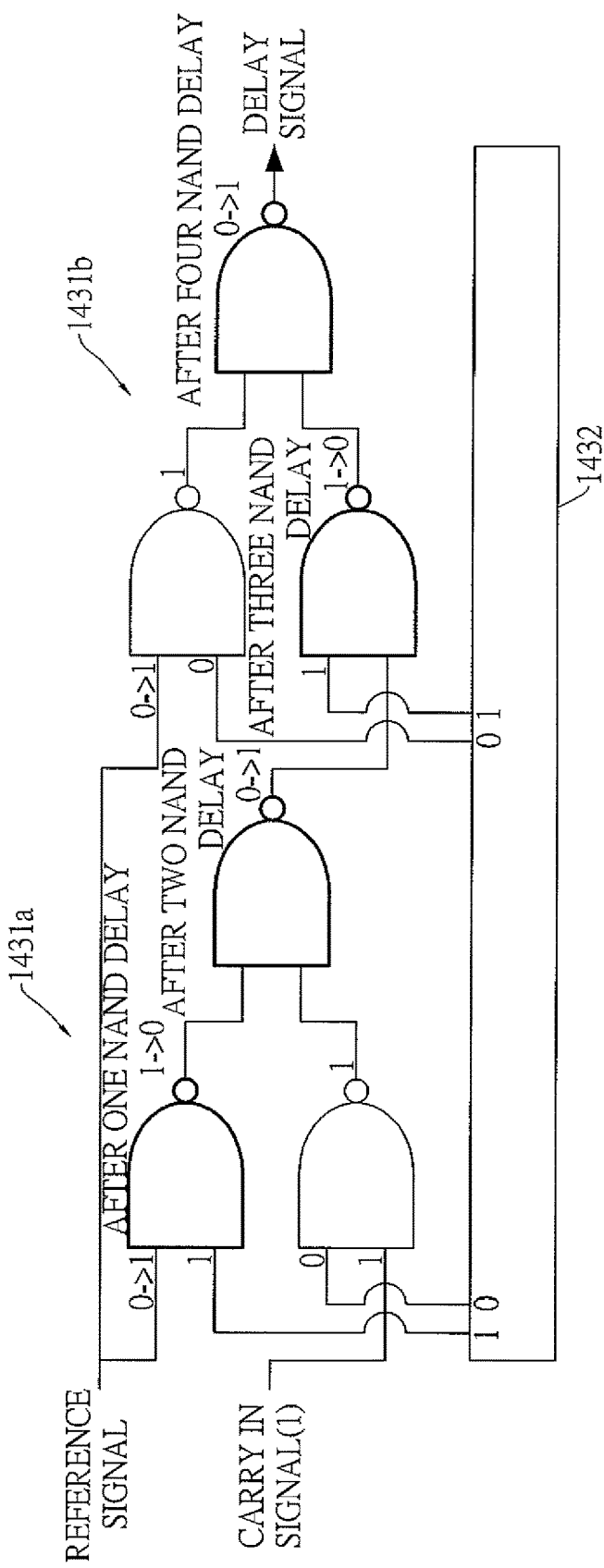
FIG. 5(b) is a block diagram of the first embodiment of the digital to time convertor of the divider-less PLL of the present invention.
Figure 5C:
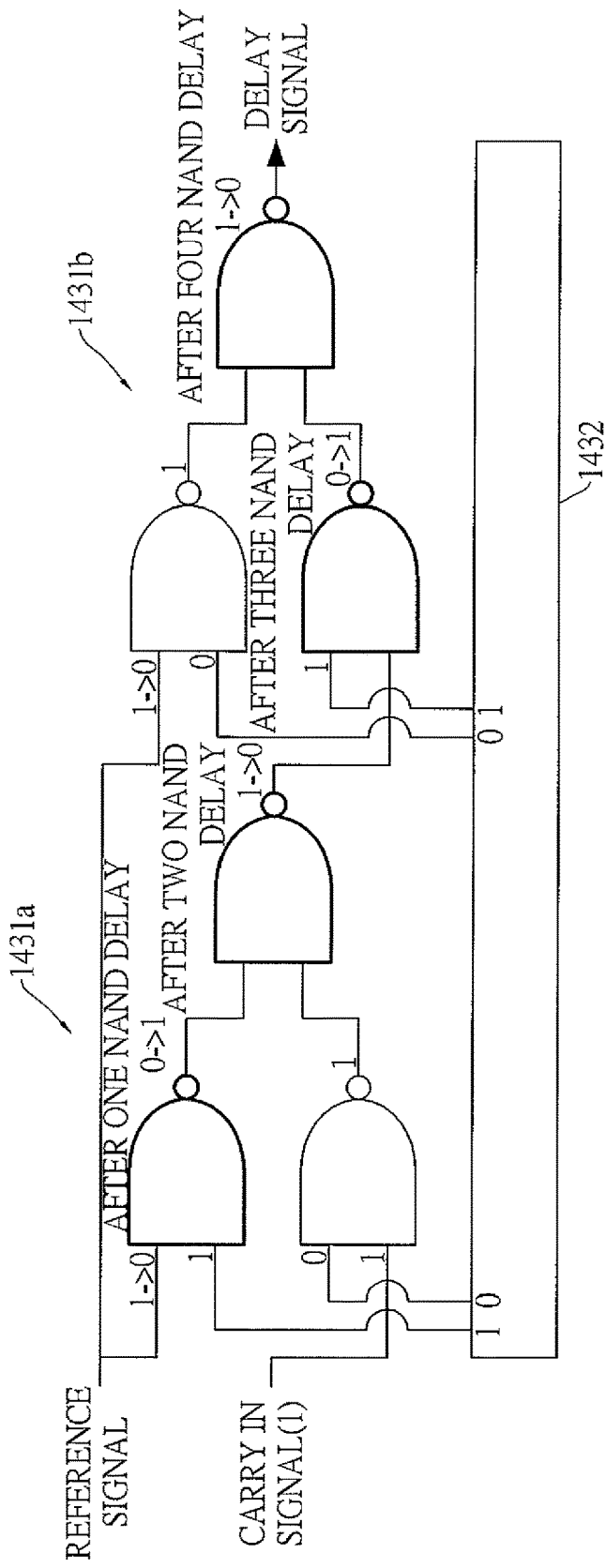
FIG. 5(c) is a block diagram of the first embodiment of the digital to time convertor of the divider-less PLL of the present invention.

For another example, with reference to FIGS. 5(a) to 5(c), the DTC 143 includes two unit cells 1431. The carry in signal is digital 1, the delay control signal inputted into the first nand gate of the first unit cell 1431a is digital 1, the delay control signal inputted into the second nand gate of the first unit cell 1431a is digital 0, the delay control signal inputted into the first nand gate of the second unit cell 1431b is digital 0, and the delay control signal inputted into the second nand gate of the second unit cell 1431b is digital 1.

As shown in FIG. 5(a), in an initial state, the reference signal is digital 0, and the delay signal is also digital 0.

As shown in FIG. 5(b), when the reference signal is changed from digital 0 to digital 1, the first output of the first unit cell 1431a will be changed from digital 1 to digital 0 after one nand delay, and the third output of the first unit cell 1431a will be changed from digital 0 to digital 1 after two nand delays.

Further, the second output of the second unit cell 1431b will be changed from digital 1 to digital 0 after three nand delays, and the third output of the second unit cell 1431*b* will be changed from digital 0 to digital 1 after four nand delays.

As shown in FIG. 5(*c*), when the reference signal is changed from digital 1 to digital 0, the first output of the first unit cell 1431*a* will be changed from digital 0 to digital 1 after one nand delay, and the third output of the first unit cell 1431*a* will be changed from digital 1 to digital 0 after two nand delays.

Further, the second output of the second unit cell 1431*b* will be changed from digital 0 to digital 1 after three nand delays, and the third output of the second unit cell 1431*b* will be changed from digital 1 to digital 0 after four nand delays.

Figure 6:
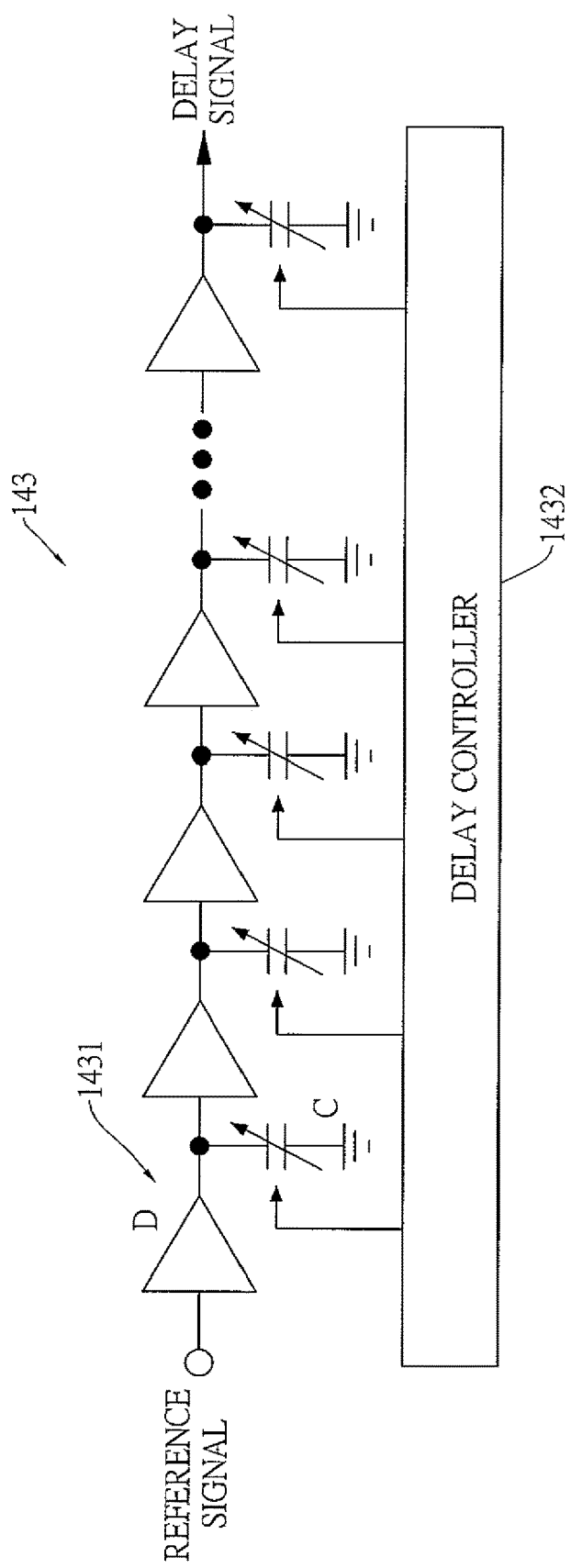
FIG. 6 is a block diagram of a second embodiment of the digital to time convertor of the divider-less PLL of the present invention.

With reference to FIG. 6, a second embodiment of the DTC 143 includes at least one unit cell 1431 and a delay controller 1432. The at least one unit cell 1431 includes a delay cell D and a capacitor C.

The delay cell D includes an input and an output. The input of the delay cell D receives the reference signal, and the output of the delay cell D outputs the delay signal.

The capacitor C is electrically connected between the output of the delay cell D and a ground.

The delay controller 1432 is electrically to the SDM 142 and the capacitor C of the at least one unit cell 1431, generates a delay control signal according to the control signal, and outputs the delay control signal to the at least one unit cell to control capacity of the capacitor C.

When the capacity of the capacitor C is increased, the delay time period of the delay cell D will also increased. Namely, the capacity of the capacitor C can control delay time period of the delay cell D, and a phase difference between the reference signal and the delay signal can be controlled by the capacity of the capacitor C.

Figure 7:
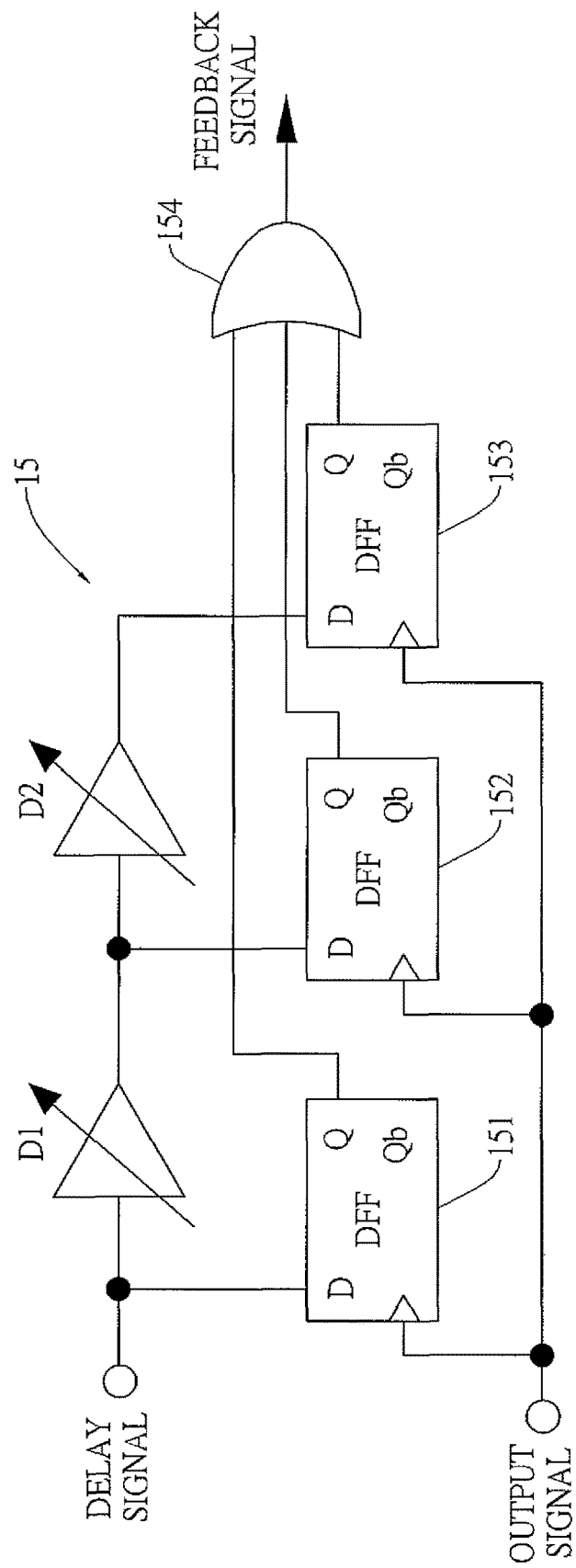
FIG. 7 is a block diagram of an embodiment of a clock gating unit of the divider-less PLL of the present invention.

With reference to FIG. 7, the clock gating unit 15 includes a first delay cell D1, a second delay cell D2, a first D flip-flop 151, a second D flip-flop 152, a third D flip-flop 153, and an OR gate 154.

The first delay cell D1 includes a first delay input and a first delay output. The first delay input is electrically connected to the delay unit 14 to receive the delay signal.

The second delay cell D2 includes a second delay input and a second delay output. The second delay input is electrically connected to the first delay output of the first delay cell D1.

The first D flip-flop 151 includes a first data input, a first output, and a first clock input. The first data input is electrically connected to the delay unit 14 to receive the delay signal.

The second D flip-flop 152 includes a second data input, a second output, and a second clock input. The second data input is electrically connected to the first delay output of the first delay cell D1.

The third D flip-flop 153 includes a third data input, a third output, and a third clock input. The third data input is electrically connected to the second delay output of the second delay cell D2.

The OR gate 154 includes three gate inputs and a gate output. Each one of the gate inputs is respectively electrically connected to the first output of the first D flip-flop 151, the second output of the second D flip-flop 152, and the third output of the third D flip-flop 153. The gate output is electrically connected to the PFD 11, and outputs the feedback signal to the PFD 11.

The clock gating unit 15 uses the output signal to re-sample the delay signal by the D flip-flops to remove delay error from the delay unit 14.

For example, with reference to FIGS. 8(*a*) to 8(*c*), a delay signal 1 is outputted by the first delay cell D1, and a delay signal 2 is outputted by the second delay cell D2.

As shown in FIG. 8(*a*), in a first case, a rising edge of the output signal is between a rising edge of the delay signal and a rising edge of the delay signal 1. A rising edge of the feedback signal occurs at the time when the output signal samples the delay signal.

As shown in FIG. 8(*b*), in a second case, the rising edge of the output signal matches the rising edge of the delay signal 1. In this case, a metastability may occur at the time when the output signal samples the delay signal 1. However, the rising edge of the feedback signal can still occur at the time when the output signal samples the delay signal. Therefore, the metastability can be prevented.

As shown in FIG. 8(*c*), in a third case, the rising edge of the output signal is between the rising edge of the delay signal 1 and a rising edge of the delay signal 2. A rising edge of the feedback signal occurs at the time when the output signal samples the delay signal or at the time when the output signal samples the delay signal 1.

Figure 9:
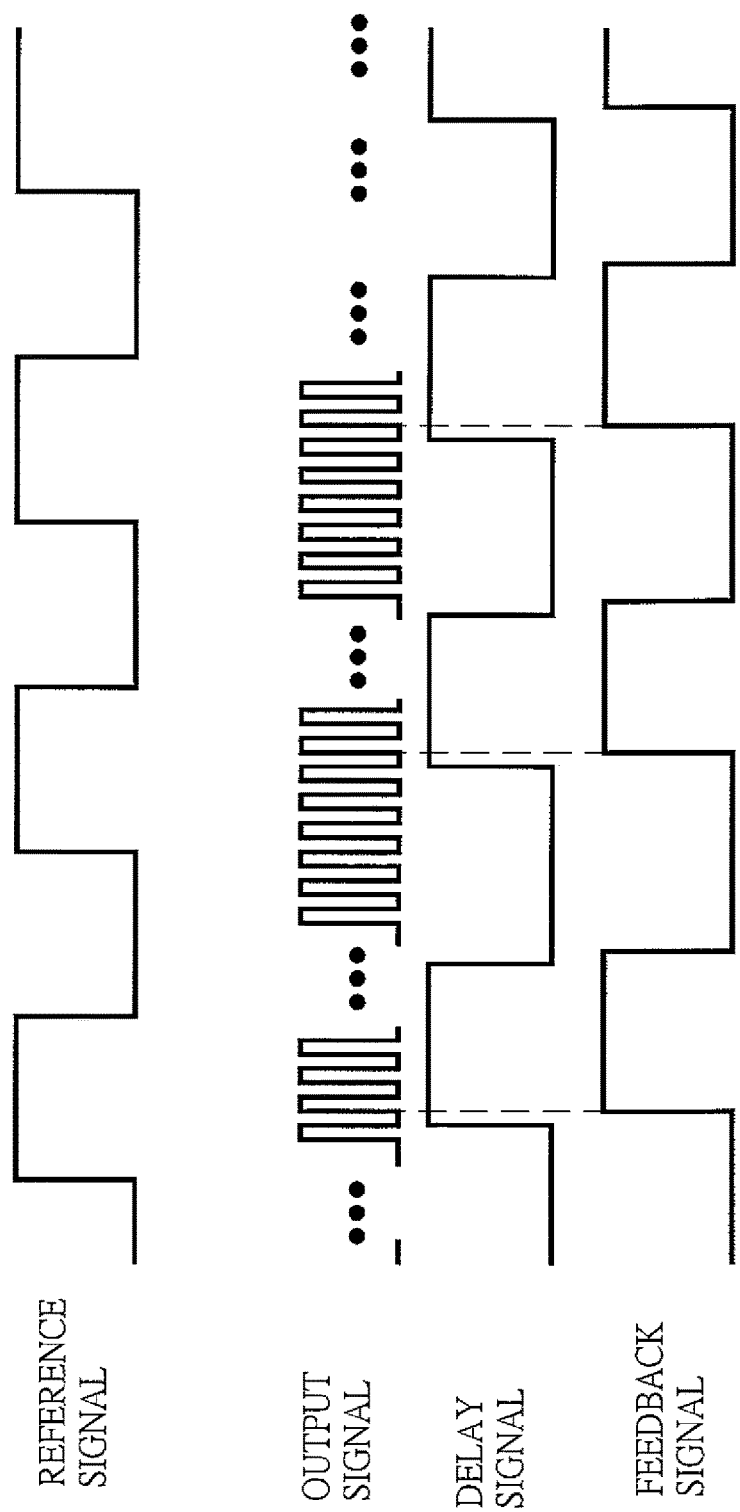
FIG. 9 is a waveform diagram of signals of the divider-less PLL of the present invention.

With reference to FIG. 9, a waveform diagram of signals of the divider-less PLL of the present invention is shown. It clearly shows that the output signal samples the delay signal to generate the feedback signal.

For example, N is a delay parameter. The divider-less PLL will adjust N until the frequency of the feedback signal equals the frequency of the input signal.

N is decided by the period of the delay signal. For example, when the period of the delay signal is 10 times to the period of the output signal, N is 10. The frequency of the output signal will be divided by 10.

Therefore, the divider-less PLL can adjust the period of the delay signal, and N can be adjusted according to the period of the delay signal. Namely, the divider-less PLL does not need a divider to divide the frequency of the output signal.

Further, the divider-less PLL of the present invention can operate in a fractional N mode. For example, in a first period of the delay signal, the period of the delay signal is 10 times to the period of the output signal. In a second period of the delay signal, the period of the delay signal is 11 times to the period of the output signal.

Therefore, the delay parameter during the first period and the second period of the delay signal will be 10.5. Namely, N is a fractional number, such as 10.5.

Moreover, N equals a divisor in an equation of $f_{OUT} \div D = f_{FB}$. $f_{out}$ is the frequency of the output signal, and $f_{fb}$ is the frequency of the feedback signal. Namely, the frequency of the output signal divided by N equals the frequency of the feedback signal.

Figure 10:
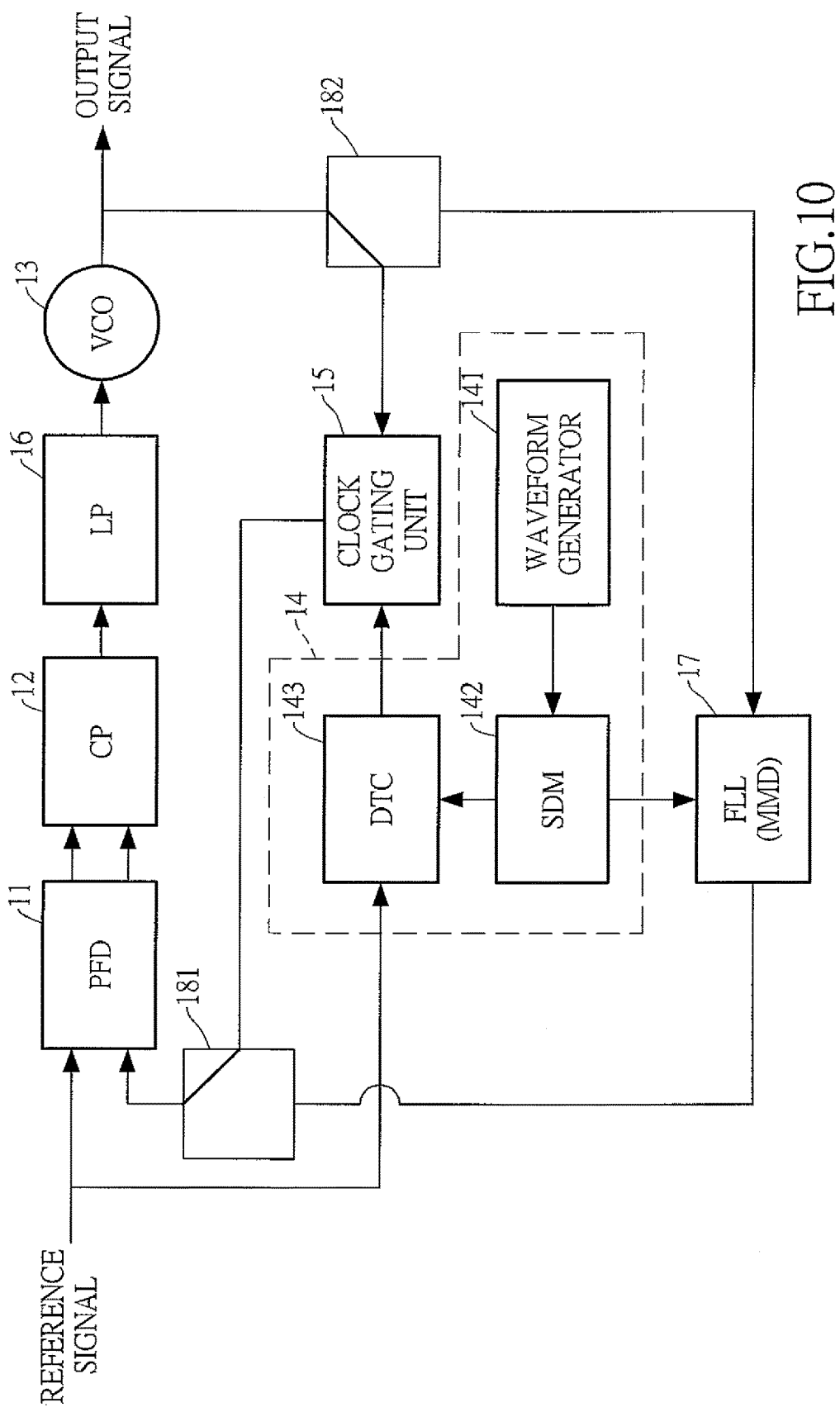
FIG. 10 is a block diagram of a third embodiment of the divider-less PLL of the present invention operating in a first mode.

With reference to FIG. 10, the divider-less PLL further includes a frequency locked loop (FLL) module 17, a first switch 181, and a second switch 182.

The first switch 181 is electrically connected to the PFD 11, the clock gating unit 15, and the FLL module 17.

The second switch 182 is electrically connected to the VCO 13, the clock gating unit 15, and the FLL module 17.

When a frequency of the reference signal and a frequency of the feedback signal are locked, the first switch 181 connects the clock gating unit 15 to the PFD 11, the clock gating unit 15 outputs the feedback signal to the PFD 11, the second switch 182 connects the VCO 13 to the clock gating unit 15, and the VCO 13 outputs the output signal to the clock gating unit 15.

Figure 11:
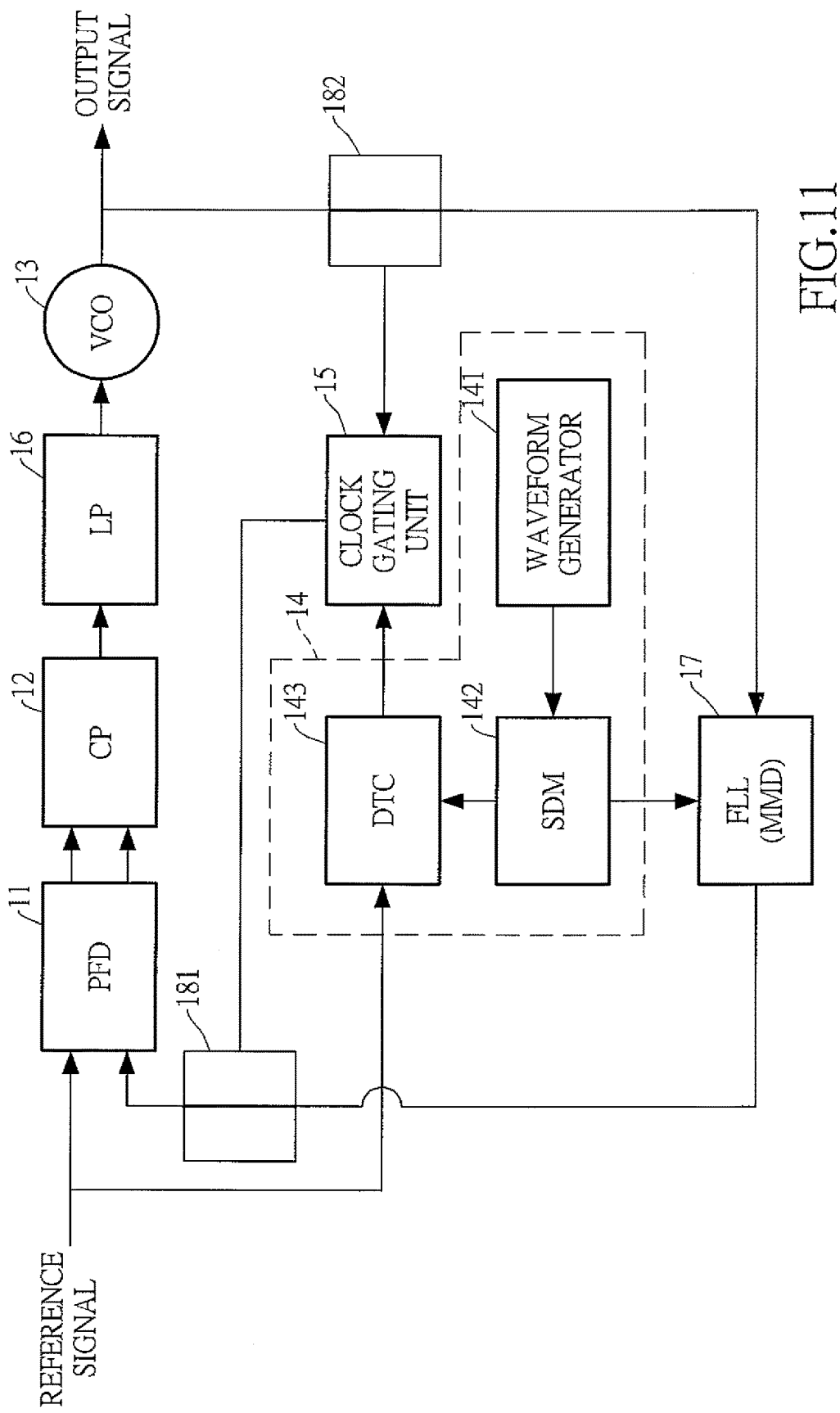
FIG. 11 is a block diagram of the third embodiment of the divider-less PLL of the present invention operating in a second mode.
Figure 12:
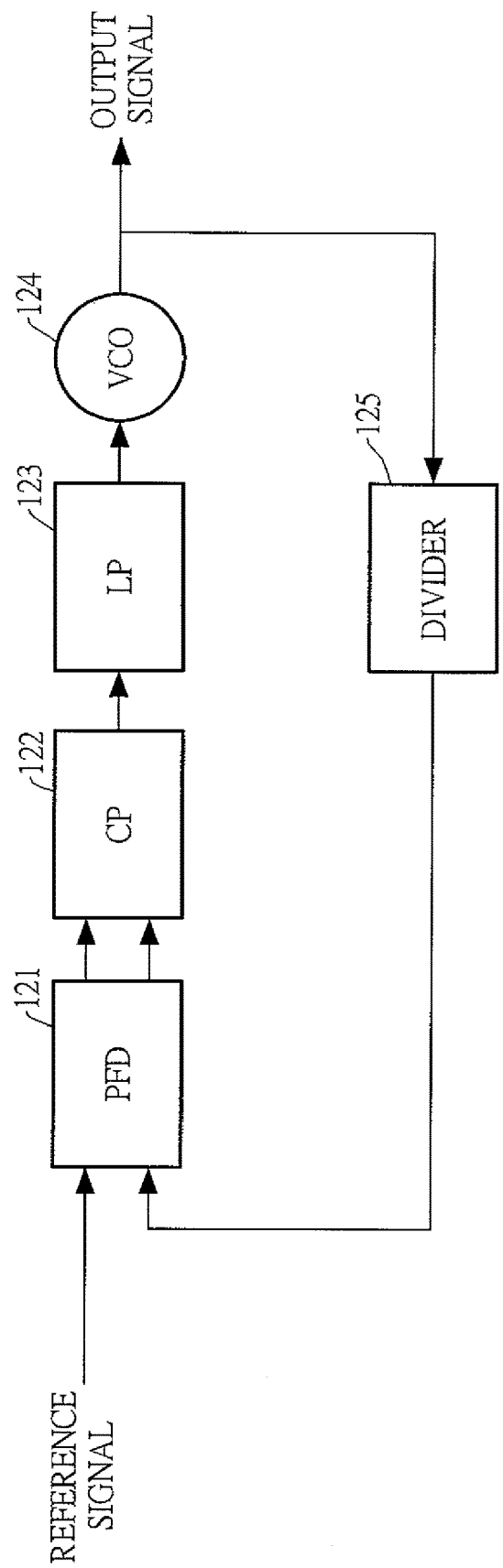
FIG. 12 is a block diagram of a conventional PLL.

Further, with reference to FIG. 11, when the frequency of the reference signal and the frequency of the feedback signal are unlocked, the first switch 181 connects the FLL module 17 to the PFD 11, the FLL module 17 outputs a frequency feedback signal to the PFD 11, the second switch 182 connects the VCO 13 to the FLL module 17, and the VCO 13 outputs the output signal to the FLL module 17.

The divider-less PLL of the present invention further uses the FLL module 17 to lock the frequency of the reference signal and the frequency of the feedback signal. When the frequency of the reference signal and the frequency of the feedback signal are locked, the first switch 181 and the second switch 182 may be switched. Then, the divider-less PLL of the present invention further can use the delay unit 14 and the clock gating unit 15 to lock a phase of the reference signal and a phase of the feedback signal. Further, when the first switch 181 and the second switch 182 are switched, the FLL module 17 can be turned off to reduce power consumption o the divider-less PLL. Therefore, the divider-less PLL can double check whether the phases or the frequencies of the reference signal and the feedback signal are locked, by using the delay unit 14, the clock gating unit 15, and the FLL module 17.

Even though numerous characteristics and advantages of the present invention have been set forth in the foregoing description, together with details of the structure and function of the invention, the disclosure is illustrative only. Changes may be made in detail, especially in matters of shape, size, and arrangement of parts within the principles of the invention to the full extent indicated by the broad general meaning of the terms in which the appended claims are expressed.

What is claimed is:

1. A divider-less phase locked loop (PLL), comprising:
   a phase frequency detector (PFD), generating an up signal and a down signal;
   a charge pump (CP), electrically connected to the PFD, and generating a voltage control signal according to the up signal and the down signal;
   a voltage controlled oscillator (VCO), electronically connected to the CP, and generating an output signal according to the voltage control signal;
   a delay unit, receiving a reference signal, and delaying the reference signal to generate a delay signal; and
   a clock gating unit, electrically connected to the PFD, the VCO, and the delay unit; wherein the clock gating unit samples the output signal according to the delay signal to generate a feedback signal;
   wherein the PFD receives the reference signal and the feedback signal, and generates the up signal and the down signal according to the reference signal and the feedback signal.

2. The divider-less PLL as claimed in claim 1, further comprising:
   a loop filter (LP); wherein the CP is electrically connected to the VCO through the LP, and the LP filters the voltage control signal.

3. The divider-less PLL as claimed in claim 2, wherein the LP is a low pass filter.

4. The divider-less PLL as claimed in claim 1, wherein the delay unit comprises:
   a waveform generator, generating a waveform signal;
   a sigma delta modulator (SDM), electrically connected to the waveform generator, and generating a control signal according to the waveform signal; and
   a digital to time convertor (DTC), electrically connected to the SDM and the clock gating unit; wherein the DTC receives the reference signal, delays the reference signal to generate the delay signal according to the control signal, and outputs the delay signal to the clock gating unit.

5. The divider-less PLL as claimed in claim 4, wherein a model of the SDM of the delay unit is MASH 1-1-1.

6. The divider-less PLL as claimed in claim 4, wherein the DTC comprises a plurality of unit cells and a delay controller;
   wherein the unit cells are connected in series, and each one of the unit cells comprises:
      a first nand gate, comprising two first inputs and a first output; wherein one of the two first inputs receives the reference signal, and another one of the two first inputs is electrically connected to the delay controller;
      a second nand gate, comprising two second inputs and a second output; wherein one of the two second inputs is electrically connected to the delay controller; and
      a third nand gate, comprising two third inputs and a third output; wherein one of the two third inputs is electrically connected to the first output, and another one of the two third inputs is electrically connected to the second output; wherein another one of the two second inputs is electrically connected to the third output of a preceding unit cell; and
   wherein the delay controller is electrically connected to the SDM, generates a delay control signal according to the control signal, and outputs the delay control signal to the unit cells.

7. The divider-less PLL as claimed in claim 4, wherein the DTC comprises at least one unit cell and a delay controller, wherein the at least one unit cell comprises:
      a delay cell, comprising an input and an output; wherein the input of the delay cell receives the reference signal; and
      a capacitor, electrically connected between the output of the delay cell and a ground; and
   wherein the delay controller is electrically connected to the SDM and the capacitor of the at least one unit cell, generates a delay control signal according to the control signal, and outputs the delay control signal to the at least one unit cell to control capacity of the capacitor.

8. The divider-less PLL as claimed in claim 1, wherein the clock gating unit comprises:
   a first delay cell, comprising a first delay input and a first delay output; wherein the first delay input is electrically connected to the delay unit to receive the delay signal;
   a second delay cell, comprising a second delay input and a second delay output; wherein the second delay input is electrically connected to the first delay output of the first delay cell;
   a first D flip-flop, comprising a first data input, a first output, and a first clock input; wherein the first data input is electrically connected to the delay unit to receive the delay signal;
   a second D flip-flop, comprising a second data input, a second output, and a second clock input; wherein the second data input is electrically connected to the first delay output of the first delay cell;
   a third D flip-flop, comprising a third data input, a third output, and a third clock input; wherein the third data input is electrically connected to the second delay output of the second delay cell; and
   an OR gate, comprising three gate inputs and a gate output; wherein each of the gate inputs is respectively electrically connected to the first output of the first D flip-flop, the second output of the second D flip-flop, and the third output of the third D flip-flop; wherein the gate output is electrically connected to the PFD, and outputs the feedback signal to the PFD.

9. The divider-less PLL as claimed in claim 1, further comprising:
   a frequency locked loop (FLL) module;
   a first switch, electrically connected to the PFD, the clock gating unit, and the FLL module;
   a second switch, electrically connected to the VCO, the clock gating unit, and the FLL module;
   wherein when a frequency of the reference signal and a frequency of the feedback signal are locked, the first switch connects the clock gating unit to the PFD, the clock gating unit outputs the feedback signal to the PFD, the second switch connects the VCO to the clock gating unit, and the VCO outputs the output signal to the clock gating unit.

10. The divider-less PLL as claimed in claim 9, wherein when the frequency of the reference signal and the frequency of the feedback signal are unlocked, the first switch connects the FLL module to the PFD, the FLL module outputs a frequency feedback signal to the PFD, the second switch connects the VCO to the FLL module, and the VCO outputs the output signal to the FLL module.

* * * * *